(12) United States Patent
Kulavik et al.

(10) Patent No.: US 8,811,629 B1
(45) Date of Patent: Aug. 19, 2014

(54) AUTOMATIC VOLUME CONTROL FOR COMBINED GAME AND CHAT AUDIO

(71) Applicant: Voyetra Turtle Beach, Inc., Campbell, CA (US)

(72) Inventors: Richard Kulavik, San Jose, CA (US); Shobha Devi Kuruba Buchannagari, Fremont, CA (US)

(73) Assignee: Voyetra Turtle Beach, Inc., Campbell, CA (US)

( * ) Notice: Subject to any disclaimer, the term of this patent is extended or adjusted under 35 U.S.C. 154(b) by 0 days.

(21) Appl. No.: 14/159,133

(22) Filed: Jan. 20, 2014

Related U.S. Application Data

(60) Provisional application No. 61/875,391, filed on Sep. 9, 2013, provisional application No. 61/908,606, filed on Nov. 25, 2013.

(51) Int. Cl.
*H03G 3/00* (2006.01)
*H03G 5/16* (2006.01)

(52) U.S. Cl.
CPC ........................... *H03G 5/16* (2013.01)
USPC ................................ 381/104; 381/74; 463/42

(58) Field of Classification Search
USPC ............... 381/1, 17, 28, 58, 74, 98, 103, 104, 381/107, 119, 309, 2, 18, 306, 307, 310, 381/311, 77, 90, 81, 85; 463/1, 35, 39, 463/40–43; 700/94; 704/500–504
See application file for complete search history.

(56) References Cited

U.S. PATENT DOCUMENTS

2013/0123019 A1* 5/2013 Sullivan et al. ................. 463/42

* cited by examiner

*Primary Examiner* — Vivian Chin
*Assistant Examiner* — Friedrich W Fahnert
(74) *Attorney, Agent, or Firm* — McAndrews, Held & Malloy, Ltd.

(57) ABSTRACT

A system may comprise an input circuit, one or more filter circuits, one or more common signal detection circuits, and a controller. The input circuit may receive combined-game-and-chat audio signals generated from a mixing together of a chat audio signal and game audio signals. The filter circuit(s) may filter a first of the combined-game-and-chat audio signals to generate a first vocal-band signal and a first non-vocal-band signal, and filter a second of the combined-game-and-chat audio signals resulting in a second vocal-band signal and a second-non-vocal band signal. The common signal detection circuit(s) may detect strength of a signal component that is common to the first vocal-band signal and the second vocal-band signal, and strength of a signal component that is common to the first non-vocal-band signal and the second non-vocal-band signal. The controller may automatically control a volume setting based on one or both of the detected strengths.

8 Claims, 11 Drawing Sheets

AUTOMATIC VOLUME CONTROL FOR COMBINED GAME AND CHAT AUDIO

PRIORITY CLAIM

This applications claims priority under 35 U.S.C. §119(e) to U.S. Provisional Patent Application Ser. No. 61/875,391 filed on Sep. 9, 2013, and to U.S. Provisional Patent Application Ser. No. 61/908,606 filed Nov. 25, 2013, each of which is titled "Automatic Volume Control for Combined Game and Chat Audio" and is hereby incorporated by reference herein in its entirety for all purposes.

INCORPORATION BY REFERENCE

The entirety of U.S. patent application Ser. No. 13/949,754 titled "Headphone System for Computer Gaming" and filed on Jul. 24, 2013 is hereby incorporated herein by reference.

TECHNICAL FIELD

Aspects of the present application relate to electronic gaming. More specifically, to methods and systems for automatic volume control for combined game and chat audio.

BACKGROUND

Limitations and disadvantages of conventional approaches to audio processing for gaming will become apparent to one of skill in the art, through comparison of such approaches with some aspects of the present method and system set forth in the remainder of this disclosure with reference to the drawings.

BRIEF SUMMARY

Methods and systems are provided for automatic volume control for combined game and chat audio, substantially as illustrated by and/or described in connection with at least one of the figures, as set forth more completely in the claims.

DETAILED DESCRIPTION

Figure 1:
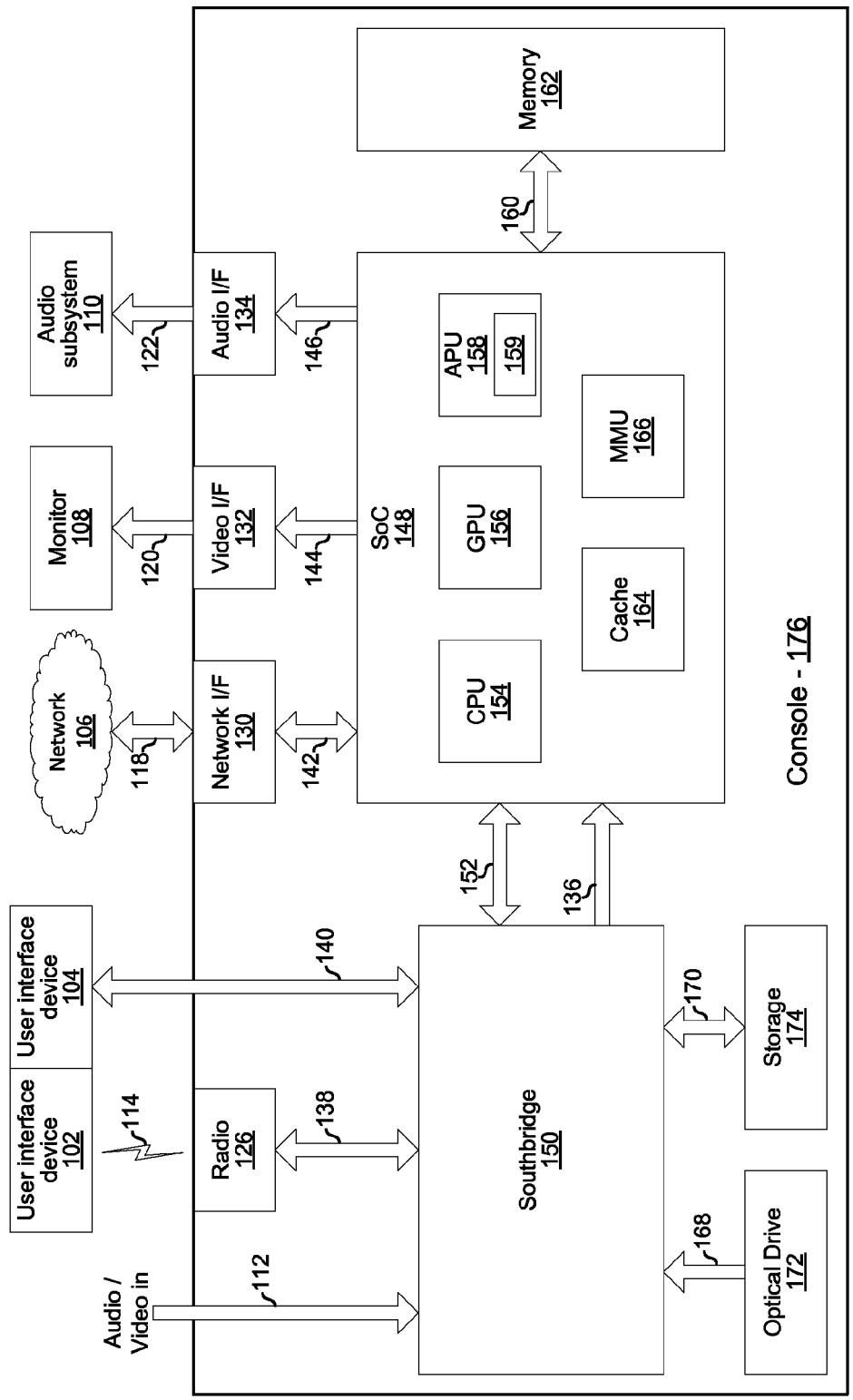
FIG. 1 depicts an example gaming console.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

In multiplayer games that are played over a local area network or the internet via a console such as Microsoft Xbox® or Sony Playstation®, game audio and voice are combined and provided via an audio output (e.g., an analog or digital output audio jack for wired output or a radio for wireless output) to which a user may connect a headset. One problem with this form of game play is that the game audio in the headset has a wide dynamic range. In other words, at times a low volume can rapidly increase to a high volume when, for instance, an explosion or other dynamic event occurs in the game. These loudness dynamics may be sustained for long periods of time, for instance during heated battle in an action game. A consequence of this wide dynamic range is that if the volume of the voice communication signals (the "chat" volume) is set for a comfortable volume level during normal game passages, they cannot be heard over the loud game audio when dynamic game passages occur. Where separate game and chat audio is provided by a gaming console to a headset, a solution for ensuring that the chat audio is comprehensible and not swamped out by the game audio is for the user to manually adjust the game and chat volumes (e.g., via buttons on his/her headset, controller, and/or in a GUI of the console). This is undesirable since it requires the player to momentarily lose control of the game as the hand moves from the game controls to adjust the chat volume level. Furthermore, where chat and game audio are premixed by the console such that separate chat and game audio signals are not available, manual, separate adjustment of chat and game volume is no longer an option. Aspects of this disclosure provide for controlling volume of chat and/or game components of combined-chat-and-game audio signals to maintain the user's ability to hear the chat audio even when the volume and frequency content of the game audio is highly variable.

Referring to FIG. 1, there is shown game console 176 which may be, for example, a Windows computing device, a Unix computing device, a Linux computing device, an Apple OSX computing device, an Apple iOS computing device, an Android computing device, a Microsoft Xbox, a Sony Playstation, a Nintendo Wii, or the like. The example game console 176 comprises a video interface 124, radio 126, data interface 128, network interface 130, video interface 132, audio interface 134, southbridge 150, main system on chip (SoC) 148, memory 162, optical drive 172, and storage device 174. The SoC 148 comprises central processing unit (CPU) 154, graphics processing unit (GPU) 156, audio processing unit (APU) 158, cache memory 164, and memory management unit (MMU) 166. The various components of the game console 176 are communicatively coupled through various busses/links 136, 128, 142, 14, 146, 152, 160, 169, and 170.

The southbridge 150 comprises circuitry that supports one or more data bus protocols such as High-Definition Multimedia Interface (HDMI), Universal Serial Bus (USB), Serial Advanced Technology Attachment 2 (SATA 2), embedded multimedia card interface (e.MMC), Peripheral Component Interconnect Express (PCIe), or the like. The southbridge 150 may receive audio and/or video from an external source via link 112 (e.g., HDMI), from the optical drive (e.g., Blu-Ray) 172 via link 168 (e.g., SATA 2), and/or from storage 174 (e.g., hard drive, FLASH memory, or the like) via link 170 (e.g., SATA 2 and/or e.MMC). Digital audio and/or video is output to the SoC 148 via link 136 (e.g., CEA-861-E compliant video and IEC 61937 compliant audio). The southbridge 150 exchanges data with radio 126 via link 138 (e.g., USB), with external devices via link 140 (e.g., USB), with the storage 174 via the link 170, and with the SoC 148 via the link 152 (e.g., PCIe).

The radio 126 may comprise circuitry operable to communicate in accordance with one or more wireless standards such as the IEEE 802.11 family of standards, the Bluetooth family of standards, and/or the like.

The network interface 130 may comprise circuitry operable to communicate in accordance with one or more wired standards and to convert between wired standards. For example, the network interface 130 may communicate with the SoC 148 via link 142 using a first standard (e.g., PCIe) and may communicate with the network 106 using a second standard (e.g., gigabit Ethernet).

The video interface 132 may comprise circuitry operable to communicate video in accordance with one or more wired or wireless video transmission standards. For example, the video interface 132 may receive CEA-861-E compliant video data via link 144 and encapsulate/format/etc., the video data in accordance with an HDMI standard for output to the monitor 108 via an HDMI link 120.

The audio interface 134 may comprise circuitry operable to communicate audio in accordance with one or more wired or wireless audio transmission standards. For example, the audio interface 134 may receive CEA-861-E compliant video data via link 144 and encapsulate/format/etc. the video data in accordance with an HDMI standard for output to the monitor 108 via an HDMI link 120.

The central processing unit (CPU) 154 may comprise circuitry operable to execute instructions for controlling/coordinating the overall operation of the game console 176. Such instructions may be part of an operating system of the console and/or part of one or more software applications running on the console.

The graphics processing unit (GPU) 156 may comprise circuitry operable to perform graphics processing functions such as compression, decompression, encoding, decoding, 3D rendering, and/or the like.

The audio processing unit (APU) 158 may comprise circuitry operable to perform audio processing functions such as volume/gain control, compression, decompression, encoding, decoding, surround-sound processing, and/or the like to output single channel or multi-channel (e.g., 2 channels for stereo or 5, 7, or more channels for surround sound) audio signals. The APU 158 comprises a memory element (e.g., a hardware or software register) 159 which stores configuration data including gain/volume settings. The configuration data may be modified via a graphical user interface (GUI) of the console and/or via an application programming interface (API) provided by the console 176.

The cache memory 164 comprises high-speed memory (typically DRAM) for use by the CPU 154, GPU 156, and/or APU 158. The memory 162 may comprise additional memory for use by the CPU 154, GPU 156, and/or APU 158. The memory 162, typically DRAM, may operate at a slower speed than the cache memory 164 but may also be less expensive than cache memory as well as operate at a higher-speed than the memory of the storage device 174. The MMU 166 controls accesses by the CPU 154, GPU 156, and/or APU 158 to the memory 162, the cache 164, and/or the storage device 174.

In FIG. 1, the example game console 176 is communicatively coupled to a user interface device 102, a user interface device 104, a network 106, a monitor 108, and audio subsystem 110.

Each of the user interface devices 102 and 104 may comprise, for example, a game controller, a keyboard, a motion sensor/position tracker, or the like. The user interface device 102 communicates with the game console 176 wirelessly via link 114 (e.g., Wi-Fi Direct, Bluetooth, and/or the like). The user interface device 102 communicates with the game console 176 via the wired link 140 (e.g., USB or the like).

The network 160 comprises a local area network and/or a wide area network. The game console 176 communicates with the network 106 via wired link 118 (e.g., Gigabit Ethernet).

The monitor 108 may be, for example, a LCD, OLED, or PLASMA screen. The game console 176 sends video to the monitor 108 via link 120 (e.g., HDMI).

The audio subsystem 110 may be, for example, a headset, a combination of headset and audio basestation, or a set of speakers and accompanying audio processing circuitry. The game console 176 sends audio to the monitor 108 via link(s) 120 (e.g., S/PDIF for digital audio or "line out" for analog audio).

Figure 2A:
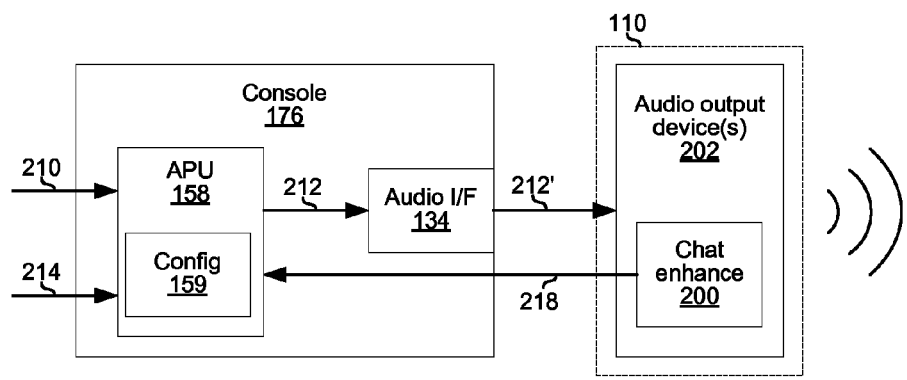
FIGS. 2A and 2B show two example audio subsystems which support enhancement of the chat component of combined-game-and-chat audio signals.

In FIG. 2A, the game console 176 is connected to an audio subsystem 110 comprising audio output device(s) 202 which, in turn, comprises audio processing circuitry 200 that is operable to perform chat enhancement as described herein. The device(s) 202 may comprise, for example, a headset with integrated audio processing circuitry or a set of speakers with integrated, or associated, audio processing circuitry. An example implementation of the headset of FIG. 2A comprising chat enhancement circuitry 200 is described with reference to FIGS. 4A-4C.

Figure 4A:
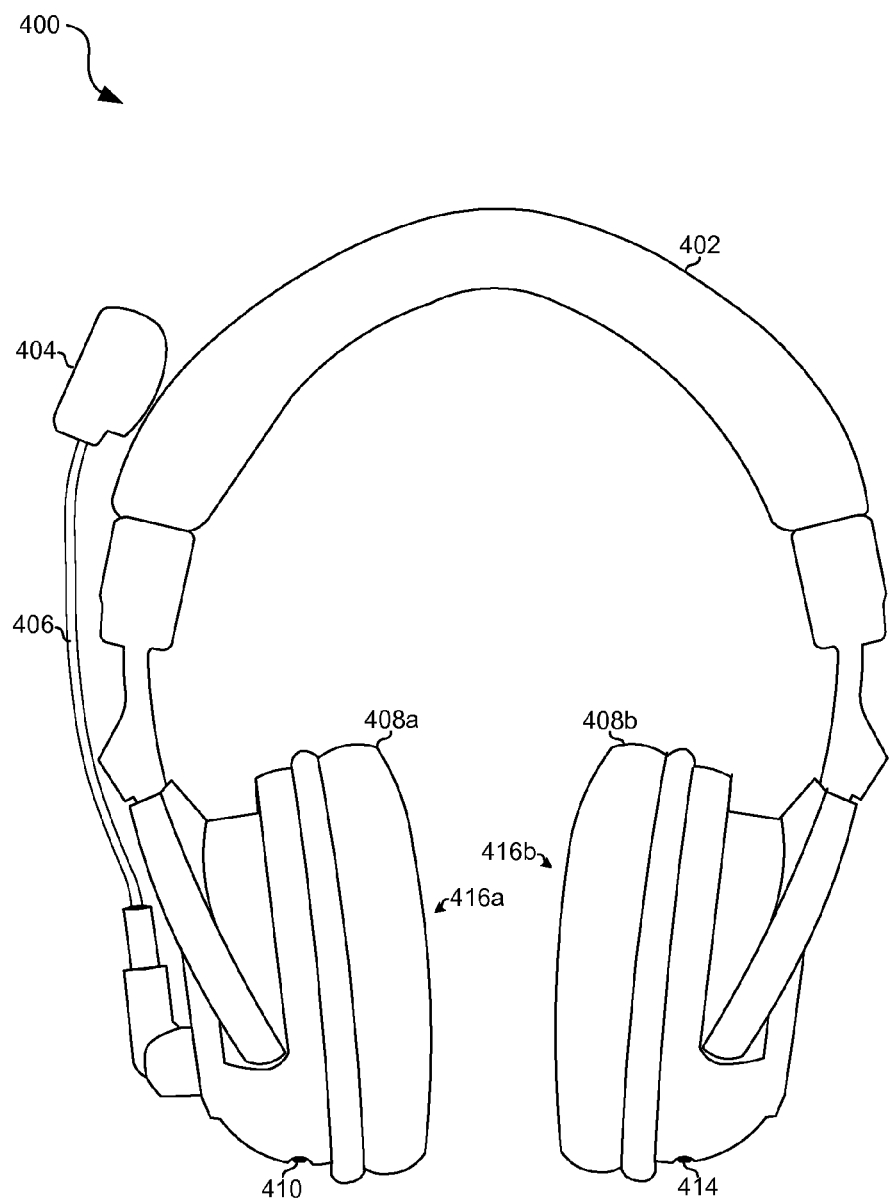
FIGS. 4A and 4B depict two views of an example embodiment of a headset operable to enhance the chat component of combined-game-and-chat audio signals.
Figure 4B:
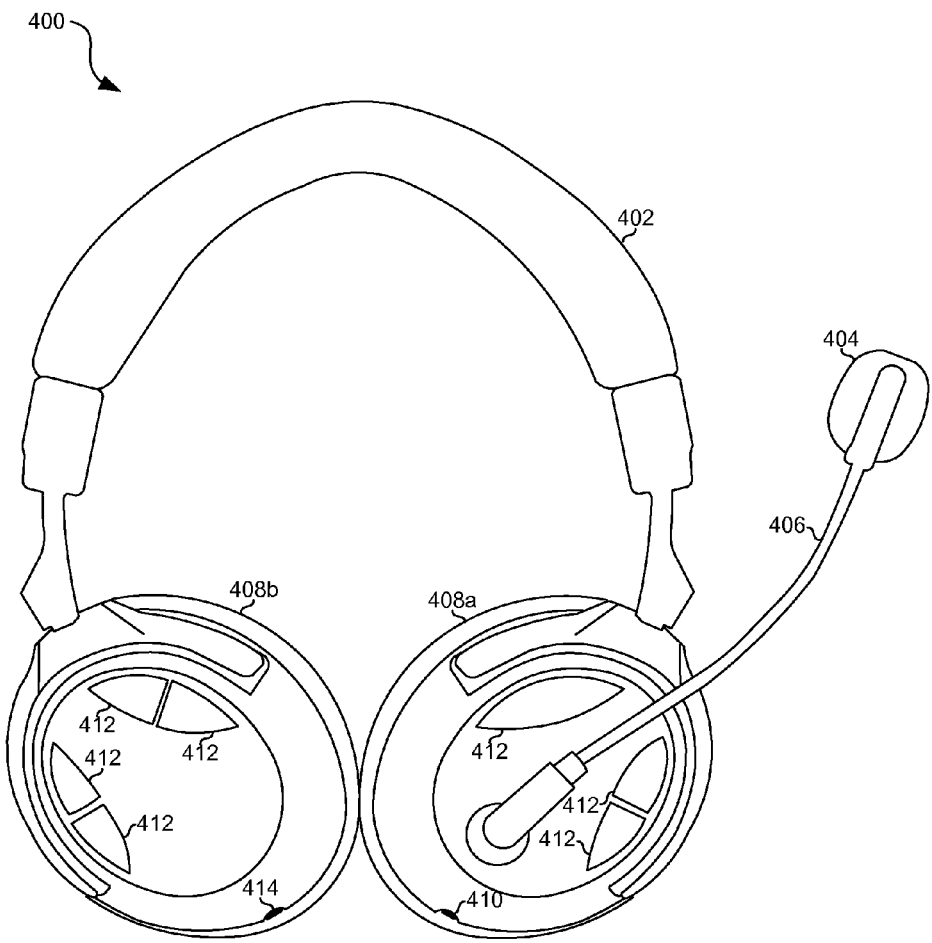

Referring to FIGS. 4A and 4B, there is shown two views of an example headset 400 that is an example embodiment of the audio output device 202 of FIG. 2A. The headset 400 comprises a headband 402, a microphone boom 406 with microphone 404, ear cups 408a and 408b which surround speakers 416a and 416b, connector 410, connector 414, and user controls 412.

The connector 410 may be, for example, a 3.5 mm headphone socket for receiving analog audio signals (e.g., receiving chat audio via an Xbox "talkback" cable).

The microphone 404 converts acoustic waves (e.g., the voice of the person wearing the headset) to electric signals for processing by the circuitry of the headset.

The speakers 416a and 416b convert electrical signals to soundwaves.

The user controls 412 may comprise dedicated and/or programmable buttons, switches, sliders, wheels, etc. for performing various functions. Example functions which the controls 412 may be configured to perform include: power the headset 400 on/off, mute/unmute the microphone 404, control gain/volume of, and/or effects applied to, chat audio by the audio processing circuitry of the headset 400, control gain/volume of, and/or effects applied to, game audio by the audio processing circuitry of the headset 400, enable/disable/initiate pairing (e.g., via Bluetooth, Wi-Fi direct, or the like) with another computing device, or the like.

The connector 414 may be, for example, a USB port. The connector 414 may be used for downloading data to the headset 400 from another computing device and/or uploading data from the headset 400 to another computing device. Such data may include, for example, configuration data that affects how audio signals in the headset 400 are processed (e.g., gain/volume settings, whether and which sound effects are added to which audio signals, etc.), and functions performed by the user controls 412. Additionally, or alternatively, the connector 414 may be used for communicating with another computing device such as a smartphone, tablet compute, laptop computer, or the like.

Figure 4C:
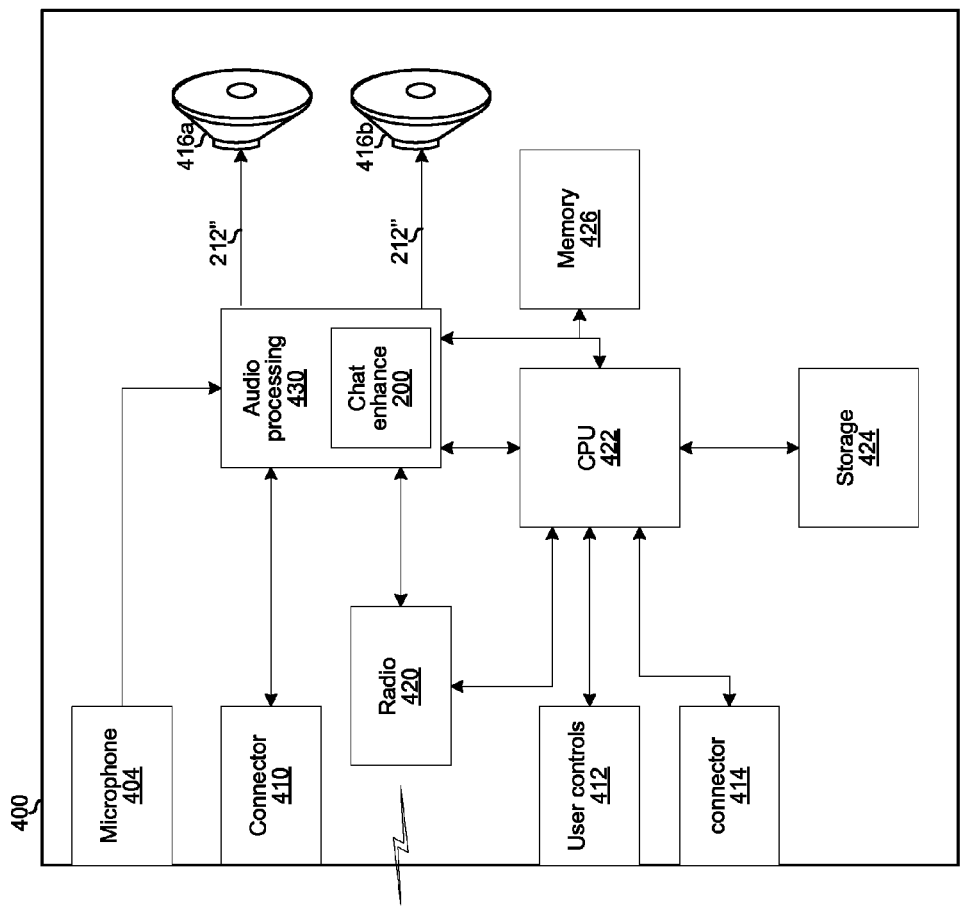
FIG. 4C depicts a block diagram of the example headset of FIGS. 4A and 4B.

FIG. 4C depicts a block diagram of the example headset 400. In addition to the connector 410, user controls 412, connector 414, microphone 404, and speakers 416a and 416b already discussed, shown are a radio 420, a CPU 422, a storage device 424, a memory 426, and an audio processing circuit 430.

The radio 420 may comprise circuitry operable to communicate in accordance with one or more standardized (such as, for example, the IEEE 802.11 family of standards, the Bluetooth family of standards, and/or the like) and/or proprietary wireless protocol(s) (e.g., a proprietary protocol for receiving audio from an audio basestation such as the basestation described below with reference to FIGS. 2B, 5A, and 5B, for example).

The CPU 422 may comprise circuitry operable to execute instructions for controlling/coordinating the overall operation of the headset 400. Such instructions may be part of an operating system or state machine of the headset 400 and/or part of one or more software applications running on the headset 400. In some implementations, the CPU 422 may be, for example, a programmable interrupt controller, a state machine, or the like.

The storage device 424 may comprise, for example, FLASH or other nonvolatile memory for storing configuration data, etc. which may be used by the CPU 422 and/or the audio processing circuitry 430 (e.g., loaded into volatile memory during runtime). Such data may include, for example, configuration data that affects how audio signals in the headset 400 are processed (e.g., affects gain/volume settings, whether and which sound effects are added to which audio signals, etc.), and functions performed by the user controls 412.

The memory 426 may comprise volatile memory used by the CPU 422 and/or audio processing circuit 430 as program memory, for storing runtime data, etc.

The audio processing circuit 430 may comprise circuitry operable to perform audio processing functions such as volume/gain control, compression, decompression, encoding, decoding, introduction of audio effects (e.g., echo, phasing, virtual surround effect, etc.), and/or the like to output audio signals comprising game, chat, and microphone audio to speaker 416a and 416b.

In operation, referring to both FIGS. 2A and 4C, chat audio, represented as arrow 210, and game audio, represented as arrow 214, are input to the APU 158 of the console 176. The chat audio may arrive, for example, via the network interface 130. The game audio may arrive, for example, via the Optical drive 172, the Storage 174, the link 112, and/or the network interface 130. The APU 158 may process the chat and game audio as necessary (e.g., decompress, decode, etc.) to recover a chat audio band signal ("chat audio") carrying voices of other players participating in a networked chat, and game audio band signals ("game audio") carrying the music, sound effects, etc. generated by the game. The chat audio may be a monophonic signal and the game audio may be a multi-channel signal.

The APU 158 may then mix together the chat audio and game audio resulting in combined-game-and-chat audio signals (represented as arrow 212). The respective strengths of the chat audio and game audio during mixing may be controlled based on gain/volume settings in the configuration data in memory element 159. For example, a first gain may be applied to a chat audio signal, a second gain may be applied to a left game audio signal and a right game audio signal, then the left game audio signal and chat audio signal may be mixed to produce a left combined-game-and-chat audio signal and the right game audio signal and chat audio signal may be mixed to produce a right combined-game-and-chat audio signal. The combined-game-and-chat audio signals are then conveyed to the audio interface 134 which suitably formats them (resulting in signals 212') for conveyance to the audio subsystem 110 (e.g., via link 122 of FIG. 1).

The combined-game-and-chat audio signals 212' arrive at the audio processing circuitry 430 via either the connector 410 or the radio 420. The audio processing circuitry 430 performs any processing (e.g., gain/volume control, introduction of sound effects, etc.) dictated by currently selected configuration data, resulting in signals 212", which are output to the speakers 416a and 416b.

Concurrent with outputting the combined-game-and-chat signals to the speakers 416a and 416b, the chat enhancement circuitry 200 processes the combined-game-and-chat audio signals to detect the strength of the chat component and/or the game component. Example details of such processing are described below with reference to FIGS. 3 and 6. Based on the detected strength(s), the chat enhancement circuitry 200 may adjust, as necessary, the volume settings in the configuration data stored in the memory element 159. The adjustment may comprise, for example, generating a volume control command 218 (e.g., sent via link 114 and/140) that causes a call of a volume adjustment function of an API provided by the game console 176. For example, if chat audio is too weak relative to the game audio a command to increase the chat audio and/or decrease the game audio may be generated. Conversely, if chat audio is too strong relative to the game audio a command to increase the chat audio and/or decrease the game audio may be generated.

In an example implementation, the signals 212' and 218 may be routed via a user interface device 104 interposed between the console 176 and the subsystem 110 (e.g., where the console is an Xbox).

Figure 2B:
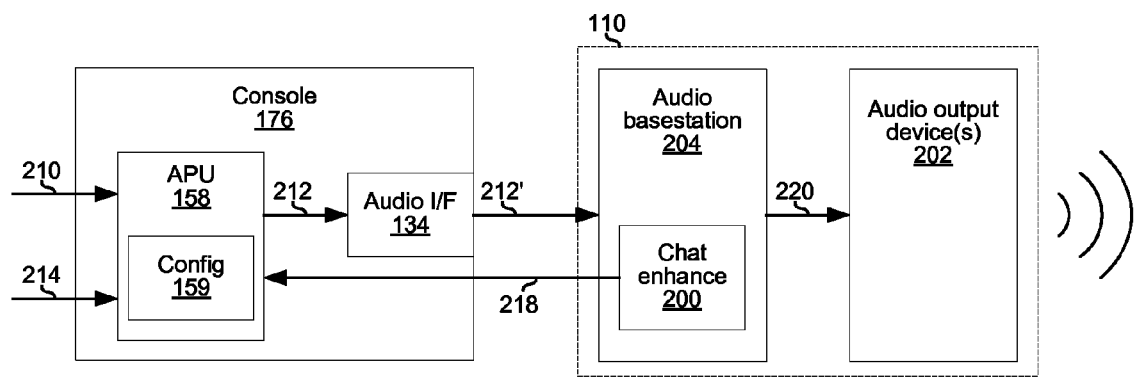

Now referring to FIG. 2B, the game console 176 is connected to an audio subsystem 110 comprising an audio basestation 204 and audio output device(s) 202. The device(s) 202 may comprise, for example, a headset similar to the headset 400 described above, but without the chat enhancement circuitry 200. The example implementation of the audio basestation 204 depicted in FIG. 2B comprises the chat enhancement circuitry 200 and is further described with reference to FIGS. 5A and 5B.

Figure 5A:
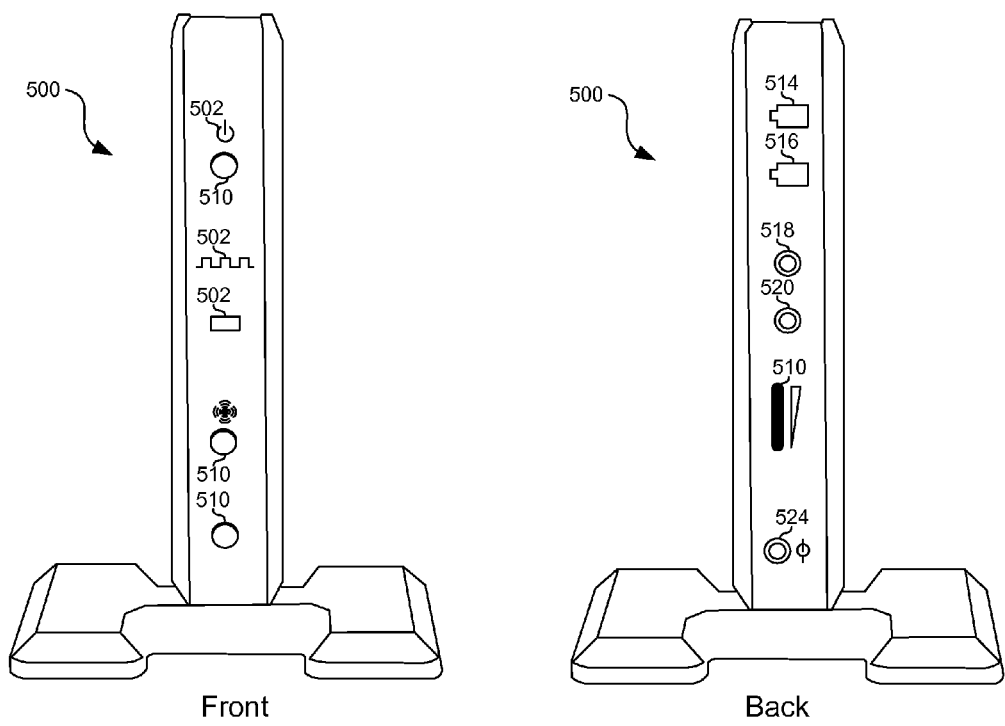
FIG. 5A depicts two views of an example embodiment of an audio basestation operable to enhance the chat component of combined-game-and-chat audio signals.

FIG. 5A depicts two views of an example embodiment of an audio basestation 500 that is an example embodiment of the audio basestation 204 of FIG. 2B. The basestation 500 comprises status indicators 502, user controls 510, power port 524, and audio connectors 514, 516, 518, and 520.

The audio connectors 514 and 516 may comprise digital audio in and digital audio out (e.g., S/PDIF) connectors, respectively. The audio connectors 518 and 520 may comprise a left "line in" and a right "line in" connector, respectively. The controls 510 may comprise, for example, a power button, a button for enabling/disabling virtual surround sound, a button for adjusting the perceived angles of the speakers when the virtual surround sound is enabled, and a dial for controlling a volume/gain of the audio received via the "line in" connectors 518 and 520. The status indicators 502 may indicate, for example, whether the audio basestation 204 is powered on, whether audio data is being received by the basestation 204 via connectors 514, and/or what type of audio data (e.g., Dolby Digital) is being received by the basestation 204.

Figure 5B:
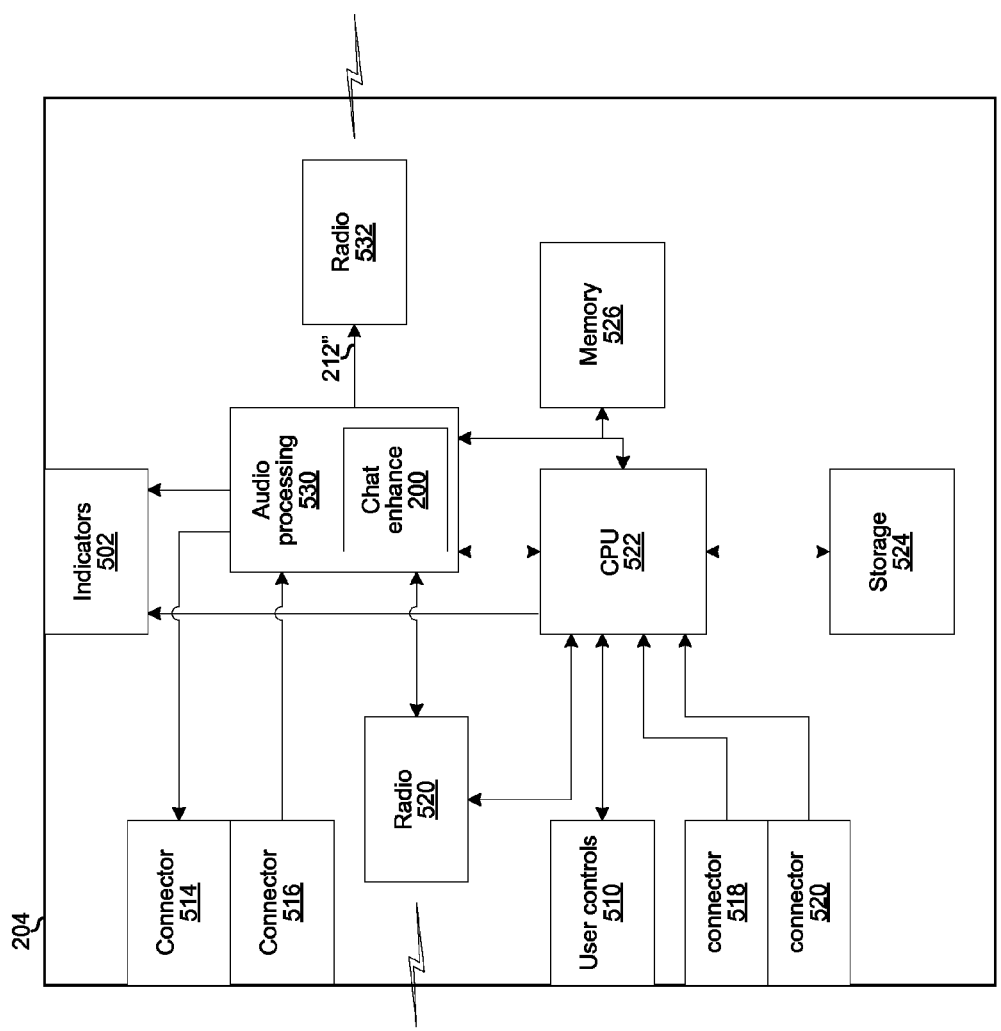
FIG. 5B depicts a block diagram of the audio basestation 400.

FIG. 5B depicts a block diagram of the audio basestation 400. In addition to the user controls 510, indicators 502, and connectors 514, 516, 518, and 520 described above, the block diagram additionally shows a CPU 522, a storage device 534, a memory 526, a radio 520, an audio processing circuit 530, and a radio 532.

The radio 520 comprises circuitry operable to communicate in accordance with one or more standardized (such as the IEEE 802.11 family of standards, the Bluetooth family of standards, and/or the like) and/or proprietary (e.g., proprietary protocol for receiving audio protocols for receiving audio from a console such as the console 176.) wireless protocols.

The radio 532 comprises circuitry operable to communicate in accordance with one or more standardized (such as, for example, the IEEE 802.11 family of standards, the Bluetooth family of standards, and/or the like) and/or proprietary wireless protocol(s) (e.g., a proprietary protocol for transmitting audio to audio output device(s) 202).

The CPU 522 comprises circuitry operable to execute instructions for controlling/coordinating the overall operation of the audio basestation 500. Such instructions may be part of an operating system or state machine of the audio basestation 500 and/or part of one or more software applications running on the audio basestation 500. In some implementations, the CPU 522 may be, for example, a programmable interrupt controller, a state machine, or the like.

The storage 534 may comprise, for example, FLASH or other nonvolatile memory for storing configuration data, etc., which may be used by the CPU 522 and/or the audio processing circuitry 530 (e.g., by being loaded into volatile memory during runtime). Such data may include, for example, configuration data that affects how audio signals in the audio basestation 500 are processed (e.g., gain/volume settings, whether and which sound effects are added to which audio signals, etc.), and functions performed by the user controls 412.

The memory 526 may comprise volatile memory used by the CPU 522 and/or audio processing circuit 530 as program memory, for storing runtime data, etc.

The audio processing circuit 530 may comprise circuitry operable to perform audio processing functions such as volume/gain control, compression, decompression, encoding, decoding, introduction of audio effects (e.g., echo, phasing, virtual surround effect, etc.), and/or the like to output audio signals comprising game and chat to the radio 532.

In operation, referring to both FIGS. 2B and 5B, the console may operate as described above with reference to FIG. 2A.

The combined-game-and-chat audio signals 212' arrive at the audio processing circuitry 530 via either the connector 514, the connectors 518 and 520, or the radio 420. The audio processing circuitry 530 performs any processing (e.g., gain/volume control, introduction of sound effects, etc.) of the combined-game-and-chat audio signals dictated by currently selected configuration data, resulting in signals 212", which are output to the radio 532. The radio 532 converts the received combined-game-and-chat audio signals to a format suitable for transmission to the audio output device(s) 202. For example, the audio basestation modulates the audio signals 212" onto an RF carrier and transmits the resulting signal 220 wirelessly to the audio output device(s) 202.

In an example embodiment, concurrent with processing the combined-game-and-chat signals for output via radio 532, the chat enhancement circuitry 200 processes the combined-game-and-chat audio signals to detect the strength of the chat component and/or the game component. Example details of such processing are described below with reference to FIGS. 3 and 6. Based on the detected strength(s), the chat enhancement circuitry 200 may adjust, as necessary, the volume settings in the configuration data stored in the memory element 159. The adjustment may comprise, for example, generating a volume control command 218 (e.g., sent via link 114 and/or 140) that causes a call of a volume adjustment function of an API provided by the game console 176. For example, if chat audio is too weak relative to the game audio a command to increase the chat audio and/or decrease the game audio may be generated. Conversely, if chat audio is too strong relative to the game audio a command to increase the chat audio and/or decrease the game audio may be generated. In an example implementation, the signal 218 may indicate a current chat-audio-to-game-audio ratio, a desired chat-audio-to-game-audio ratio, and/or a desired increase or decrease in the chat-audio-to-game-audio ratio.

The audio output device 202 receives the signal 220, demodulates it to recover the combined-game-and-chat audio signals 212", performs any additional desired audio processing, and outputs to speakers such as the speakers 416a and 416b.

Figure 3A:
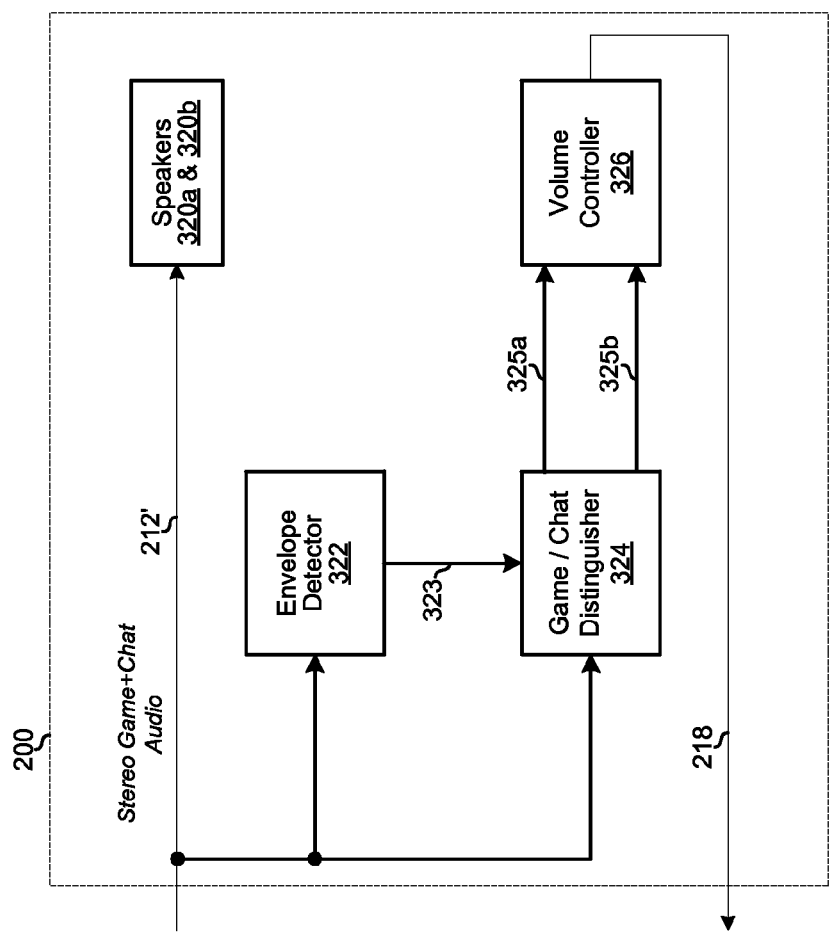
FIG. 3A depicts a high-level block diagram of example circuitry for enhancing the chat component of combined-game-and-chat audio signals.

Now referring to FIG. 3A depicts a high-level block diagram of example chat enhancement circuitry. In the example implementation of FIG. 3A, the circuitry 200 comprises speakers 320a and 320b, an envelope detector 322, a game/chat distinguisher 324, and a volume controller 326. The envelope detector 322 may determine the envelope of signal 212'. The game/chat distinguisher 323 may separate the envelope into a game audio envelope 325a and a chat audio envelope 325b. The volume controller 326 may calculate the chat-audio-to-game-audio ratio and generate the signal 218 based on the signals 325a and 325b.

Figure 3B:
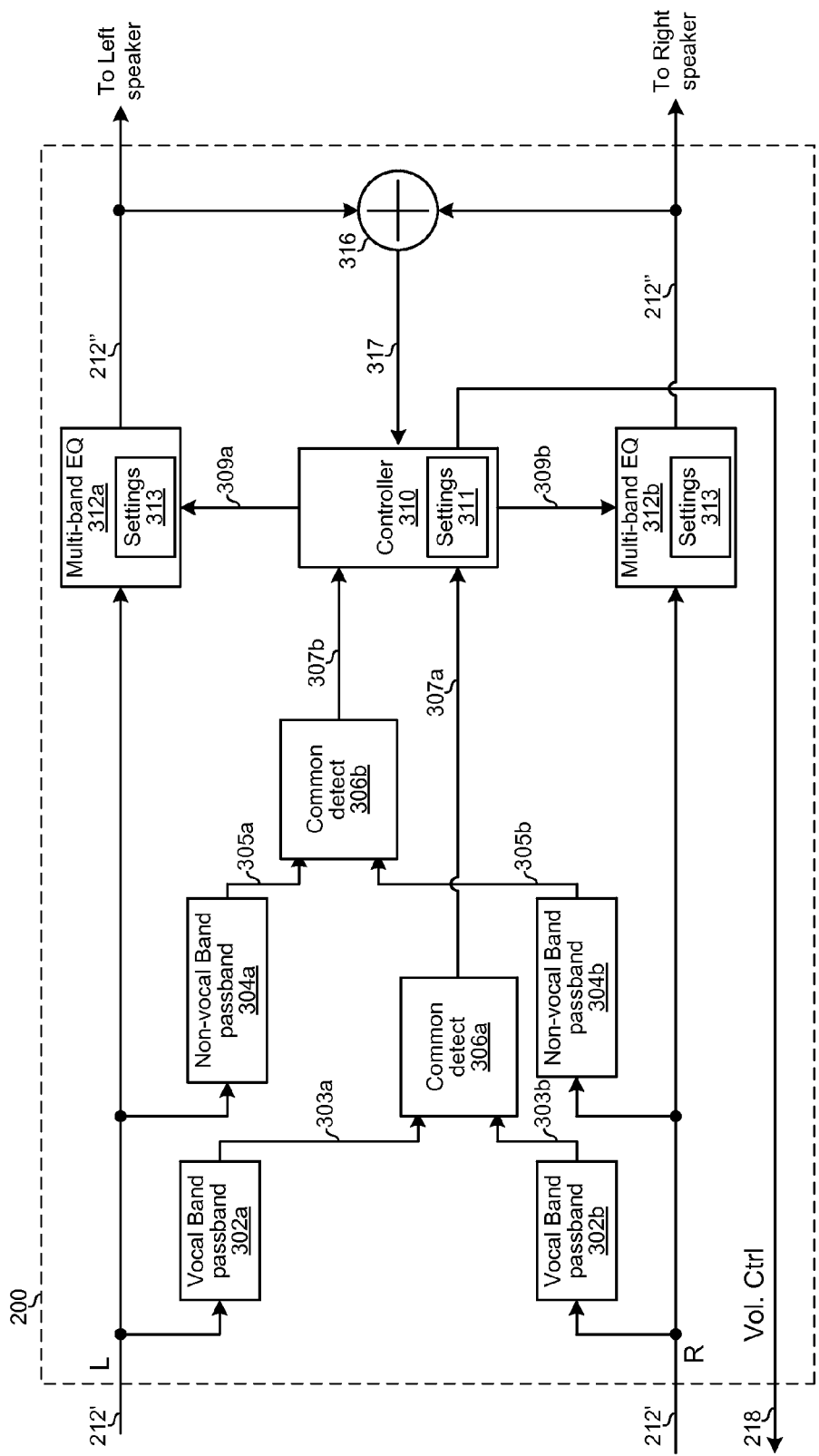
FIG. 3B depicts example circuitry for enhancing the chat component of combined-game-and-chat audio signals.

Now referring to FIG. 3B there is shown example circuitry for enhancing the chat component of a combined-game-and-chat audio stream. The example chat enhancement circuitry 200 comprises filters 302a, 302b, 304a, and 304b; common signal detection circuits 306a and 306b; controller 310; multi-band equalizers 312a and 312b; and combiner 316.

Each of the filters 302a, 302b, 304a, and 304b is operable to pass, from its input to its output, a selected range of frequencies (the "passband") with relatively little attenuation while other frequencies experience relatively high attenuation between the input and output of the filter. In an example implementation, the passband of filters 302a and 302b may substantially coincide with the frequency range of the human voice from approximately 300 Hz to 3000 Hz (the "vocal band"). In an example implementation, the passband(s) of filters 304a and 304b may substantially not overlap with the vocal band (i.e., may have a notch corresponding to the vocal band).

Each of the common signal detection circuits 306a and 306b is operable to detect the strength of a signal component that is common to its two inputs and output that strength via a respective one of signals 307a and 307b. In an example implementation, the signal strengths may be output as a root mean square (RMS) values. In an example implementation, prior to measuring the signal component that is common to its two inputs, the circuit 306a may look for characteristics that indicate the presence of speech. These may be characteristics of speech in general and/or characteristics of speech that has passed over the band-limited chat audio channel. Example characteristics that the circuit 306a may inspect for include the presence of harmonics, formants, and/or pitch modulation. If the circuit 206a determines that speech is not present based on these characteristics, it may output a default strength (e.g., 0) on the signal 307a rather than an actual measured strength.

The combiner 316 may be operable to add the left combined-game-and-chat audio signal 212' (or 212" if the equalizers 213 are present and have modified the signal) to the right combined-game-and-chat audio signal 212' (or 212" if the equalizers 213 are present and have modified the signal) and output the strength (e.g., as an RMS value) of the combined signal via signal 317. Additionally or alternatively, the combiner 316 may be operable to subtract the left[or right] combined-game-and-chat audio signal 212' (or 212" if the equalizers 213 are present and have modified the signal) from the right[or left] combined-game-and-chat audio signal 212' (or 212" if the equalizers 213 are present and have modified the signal) and output the strength (e.g., as an RMS value) of the difference signal via signal 317.

Each of the multi-band equalizers 312a and 312b may be operable to apply at least a first gain to a first set of frequencies (e.g., vocal band frequencies) of the respective one of the combined-game-and-audio signals 212' and a second gain to a second set of frequencies (e.g., non-vocal-band frequencies). The volume/gain settings for the equalizers 312a and 312b may be determined by configuration data stored in their respective memory elements (e.g., hardware or software register) 313 which may be modified by the controller 310 via a respective one of signals 309a and 309b. The output of EQ 312a may be applied to a left speaker (not shown). The output of EQ 312b may be applied to a right speaker (not shown).

The controller 310 may be operable to modify the volume/gain settings in the configuration data in memory element 313 of the multi-band equalizers 312a, the volume/gain settings in the configuration data in memory element 313 of the multi-band equalizer 312b, and/or the volume/gain settings in the configuration data in memory element 159 of the APU 158. Modifications to the gain/volume settings may be based on the signal strength values received via signals 307a, 307b, and 317. The controller 310 may adjust the gain/volume settings automatically without need for user intervention. The adjustments may be based on other configuration which may, for example, also be stored in memory element 311, and which may be pre-configured to factory defaults and/or configurable via a graphical user interface and/or API provide by the audio subsystem 110 in which the circuitry 200 is installed. Examples of such other configuration data include maximum gain/volume, minimum gain/volume, target gain/volume, maximum game-audio-to-chat-audio ratio, minimum game-audio-to-chat-audio ratio, target game-audio-to-chat-audio, and/or the like.

Figure 6:
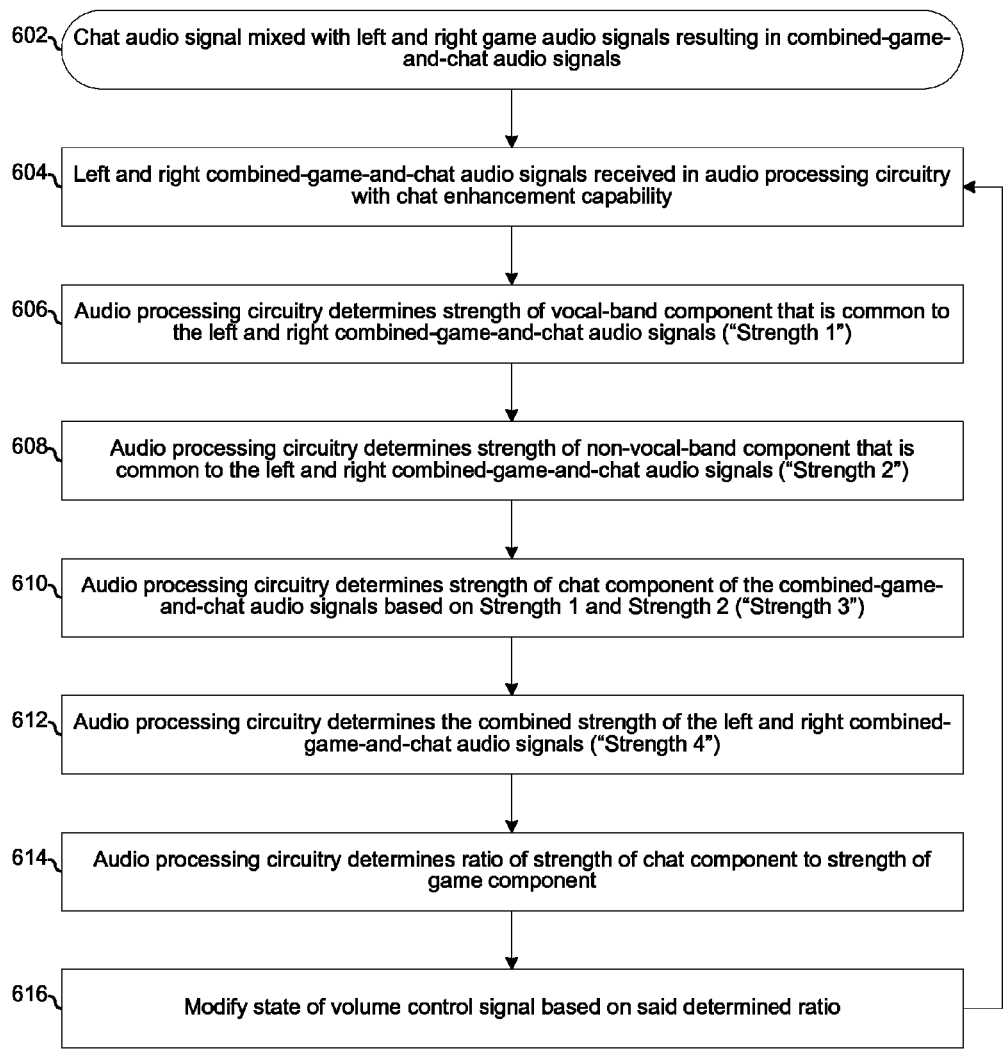
FIG. 6 depicts a flowchart of an example process for enhancing the chat component of combined-game-and-chat audio signals.

FIG. 6 depicts a flowchart of an example process for enhancing the chat component of combined-game-and-chat audio signals. In block 602, a chat audio signal (e.g., 210 of FIG. 2A) is mixed with left and right game audio signals (e.g., 214 of FIG. 2A) resulting in combined-game-and-chat audio signals (e.g., 212' of FIG. 2A).

In block 604, the left and right combined-game-and-chat audio signals are received in audio processing circuitry having chat enhancement capability (e.g., 430 of FIG. 4C or 530 of FIG. 5B).

In block 606, the audio processing circuitry determines strength ("Strength 1") of vocal-band component that is common to the left and right combined-game-and-chat audio signals.

In block 608, the audio processing circuitry determines strength ("Strength 2") of non-vocal-band component that is common to the left and right combined-game-and-chat audio signals.

In block 610, the audio processing circuitry determines strength ("Strength 3") of a chat component of the combined-game-and-chat audio signals based on Strength 1 and Strength 2 according to the following expression: Strength 3=Strength 1−Strength 2. This calculation makes the assumption that the common non-vocal component is broadband and thus also present in the common vocal component.

In block 612, the audio processing circuitry determines strength ("Strength 4") of game audio to be the difference between the left combined-game-and-chat audio signal and the right combined-game-and-chat audio signal, since the chat is common to both left and right and cancels out as a result of the subtraction.

In block 614, the audio processing circuitry determines the ratio of Strength 3 ("chat") to Strength 5 ("game").

In block 616, a command to modify chat and/or game volume is generated if necessary based on said determined ratio.

Figure 7:
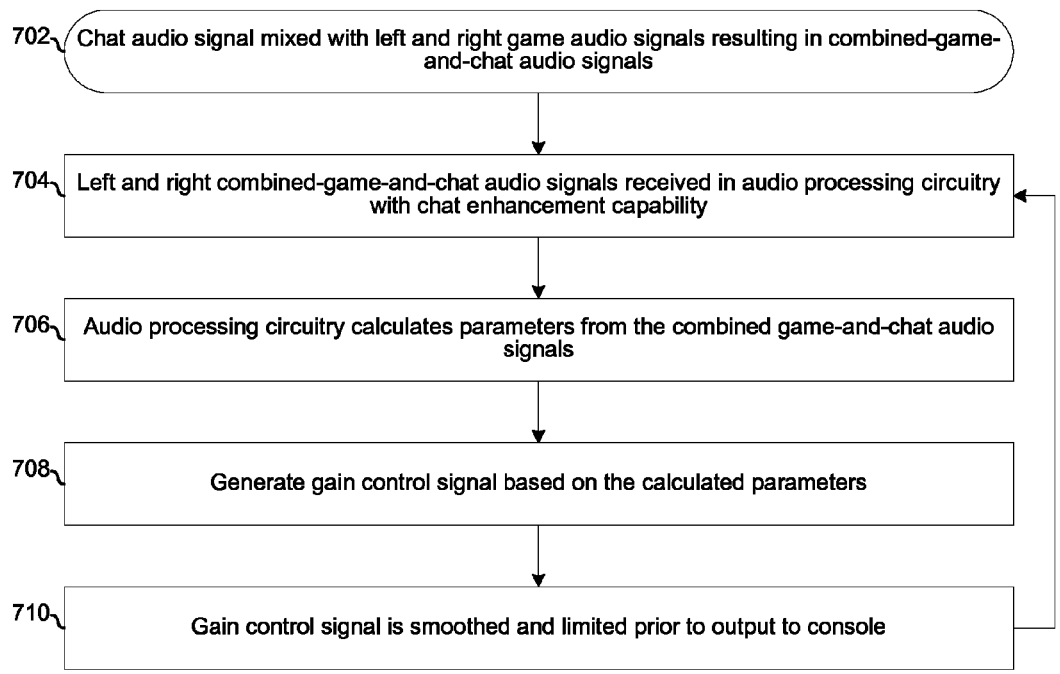
FIG. 7 depicts a flowchart of an example process for enhancing a voice component of combined combined-game-and-chat audio signals.

FIG. 7 depicts a flowchart of an example process for enhancing a voice component of combined-game-and-chat audio signals.

In block 702, a chat audio signal (e.g., 210 of FIG. 2A) is mixed with left and right game audio signals (e.g., 214 of FIG. 2A) resulting in combined-game-and-chat audio signals (e.g., 212' of FIG. 2A).

In block 704, the left and right combined-game-and-chat audio signals are received in audio processing circuitry having chat enhancement capability (e.g., 430 of FIG. 4C or 530 of FIG. 5B).

In block 706, the audio processing circuitry (e.g., 430 of FIG. 4C or 530 of FIG. 5B) calculates one or more of the following parameters based on the combined-game-and-chat audio signals: total energy, difference energy, center channel vocal-band energy, non-vocal-band energy, autocorrelation, cepstrum.

The total energy may, for example, be calculated as the sum of energy in the left and right channels and smoothed with a first order recursive filter.

The difference energy may, for example, be calculated as the averaged difference between the left and right channels. The difference energy may represent the content of the game audio that is not correlated between left and right channels. When the difference energy is a high percentage of the total energy, it may be determined that speech is present in the combined-game-and-chat audio signals.

The center channel voice band energy may, for example, be calculated by passing the left and right channels through a voice band filter and then correlating the filter outputs with zero lag to determine the voice band energy in the center surround channel. The ratio of the center channel voice band energy to the total energy may be used to determine whether speech is present in the combined-game-and-chat audio signals.

The non-vocal-band energy may, for example, be calculated by summing the left and right channels and passing the sum through a vocal-band band-stop filter. The filter may remove chat signals such that the energy of the filtered signal is primarily from game audio.

The autocorrelation of the each of the received left and right combined-game-and-chat audio signals may have peaks at the pitch period. If the pitch of a signal falls within the vocal band, the audio processing circuitry may determine speech is present in the signal.

The cepstrum of the input may be calculated for the left and right channels. For speech, as it is rich in harmonics, the cepstrum will have a peak at the pitch period. The richer the harmonics, the stronger is the peak. The strength of the peak indicates the strength of harmonics with respect to the background game sound. The presence of pitch period in voice band and its modulation may result in the audio processing circuitry determining that speech is present in the signals.

In block 708, the audio processing circuitry generates a gain control signal (e.g., 218).

In block 710, the gain control signal 218 is smoothed (e.g., by controlling attack and release times to give the audio source sufficient time to respond) to prevent "pops" in the audio. In block 710, a limit may also be applied such that the chat is prevented from being increased or decreased beyond determined threshold levels (e.g., user-defined).

In addition to its application to gaming with online chat. Aspects of this disclosure are also applicable to enhancing one component of any signal that is the result of mixing together two signals having different bandwidths. In this regard, while the filters 302 and 304 of FIG. 3B were configured to pass vocal-band and non-vocal-band frequencies, respectively, in the example embodiment described, this disclosure is not so limited. The filters 302 can be configured to pass any first set of frequencies and the filters 304 can be configured to pass any second set of frequencies different than the first set of frequencies. As another example, a user may be listening to music on his phone while simultaneously participating in a voice call. The call audio and the music audio may be mixed together for transmission to the user's headset. The headset may comprise the chat enhancement circuitry 200 for enhancing the call audio to ensure it remains audible and intelligible over the music. Where each of the mixed together audio signals have a vocal component (e.g., participating in a voice call while simultaneously listening to a soundtrack of a movie), aspects of this disclosure may still enable enhancing the call audio to ride above the actor's voices due to the fact that the soundtrack will typically have higher bandwidth allowing for the presence of harmonics of the actor's voices, which enables distinguishing those voices from the much more band limited voice call.

In an example implementation of this disclosure, a system may comprise an input circuit (e.g., connector 514 or radio 420 or radio 520), one or more filter circuits (e.g., 302a, 302b, 304a, and 304b) one or more common signal detection circuits (e.g., 304a and 304b), and a controller (e.g., 310). The input circuit may be operable to receive combined-game-and-chat audio signals generated from a mixing together of a chat audio signal and game audio signals. The one or more filter circuits may be operable to filter a first of the combined-game-and-chat audio signals to generate a first vocal-band signal and a first non-vocal-band signal. The one or more filter circuits may be operable to filter a second of the combined-game-and-chat audio signals resulting in a second vocal-band signal and a second-non-vocal band signal. The one or more common signal detection circuits may be operable to detect strength of a signal component that is common to the first vocal-band signal and the second vocal-band signal. The one or more common signal detection circuits may be operable to detect a strength of a signal component that is common to the first non-vocal-band signal and the second non-vocal-band signal. The controller may be operable to automatically control a volume setting based on one or both of: the detected strength of the chat component, and the detected strength of the game component.

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip. Some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system comprising an input circuit, one or more filter circuits, one or more common signal detection circuits, and a controller, wherein:
　　said input circuit is operable to receive combined-game-and-chat audio signals generated from a mixing together of a chat audio signal and game audio signals;
　　said one or more filter circuits is operable to:
　　　filter a first of said combined-game-and-chat audio signals to generate a first vocal-band signal and a first non-vocal-band signal;
　　　filter a second of said combined-game-and-chat audio signals resulting in a second vocal-band signal and a second non-vocal-band signal;
　　said one or more filter circuits is operable to:
　　　detect a strength of a first signal component that is common to said first vocal-band signal and said second vocal-band signal;
　　　detect a strength of a second signal component that is common to said first non-vocal-band signal and said second non-vocal-band signal;
　　said controller is operable to automatically control a volume setting based on one or both of: said detected strength of said first signal component, and said detected strength of said second signal component.

2. The system of claim 1 comprising a combiner circuit, wherein:
said combiner circuit is operable to a combine said first and said second of said combined-game-and-chat audio signals to generate a combined audio signal; and
said controller is operable to automatically control said volume setting based on a strength of said combined audio signal.

3. The system of claim 1, comprising a multi-band equalizer circuit that is operable to:
apply a first gain to vocal-band frequencies of said combined-game-and-chat audio signals; and
apply a second gain to a non-vocal-band frequencies of said combined-game-and-chat audio signals.

4. The system of claim 3, wherein said controller is operable to:
generate one or more control signals that control said first gain and said second gain, wherein a state of said one or more control signals is determined based on one or both of: said detected strength of said first signal component, and said detected strength of said second signal component.

5. The system of claim 1, wherein:
said chat audio signal is a monophonic signal having energy substantially contained in the vocal band from approximately 300 Hz to approximately 3000 Hz;
said game audio signals comprise a left channel signal having significant energy outside of said vocal band; and
said game audio signals comprise a right channel signal having significant energy outside of said vocal band.

6. The system of claim 1, said controller is operable to automatically control said volume setting based on a ratio of said detected strength of said first signal component to said detected strength of said second signal component.

7. The system of claim 1, wherein said system is a headset.

8. The system of claim 1, wherein said system is a game console.

* * * * *